United States Patent
Yanagi et al.

(10) Patent No.: US 6,821,869 B2
(45) Date of Patent: Nov. 23, 2004

(54) PHOTOMASK, METHOD OF GENERATING RESIST PATTERN, AND METHOD OF FABRICATING MASTER INFORMATION CARRIER

(75) Inventors: Terumi Yanagi, Osaka (JP); Nobuyuki Komura, Kyoto (JP); Tatsuaki Ishida, Shiga (JP); Keizo Miyata, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 53 days.

(21) Appl. No.: 10/139,379

(22) Filed: May 7, 2002

(65) Prior Publication Data

US 2002/0168839 A1 Nov. 14, 2002

(30) Foreign Application Priority Data

May 11, 2001 (JP) .................................... P2001-142203
Jun. 11, 2001 (JP) .................................... P2001-175223

(51) Int. Cl.$^7$ ............................................. H01L 21/425
(52) U.S. Cl. ........................................ 438/524; 438/551
(58) Field of Search ............................ 438/524, 3, 535, 438/551, 552, 553, 732, 733, 735, 736

(56) References Cited

U.S. PATENT DOCUMENTS

| | | | | |
|---|---|---|---|---|
| 5,514,499 A | * | 5/1996 | Iwamatsu et al. | 430/5 |
| 5,955,244 A | * | 9/1999 | Duval | 430/314 |
| 6,172,363 B1 | * | 1/2001 | Shinada et al. | 250/310 |
| 6,433,944 B1 | * | 8/2002 | Nagao et al. | 360/16 |
| 6,541,182 B1 | * | 4/2003 | Louis Joseph Dogue et al. | 430/296 |
| 6,608,317 B1 | * | 8/2003 | Nakasuji | 250/492.22 |

FOREIGN PATENT DOCUMENTS

JP     10040544     2/1998

* cited by examiner

Primary Examiner—David Nhu
(74) Attorney, Agent, or Firm—McDermott Will & Emery LLP

(57) ABSTRACT

A recess for deaeration is formed in the surface of a resist film by using the photolithography technique, a photomask is allowed to come into contact with projections for close contact on both sides or around the recess for deaeration, and evacuation is performed via the recess for deaeration, thereby enhancing close contact between the photomask and the projections for close contact. With the configuration, a resist pattern having an accurate recess while preventing diffraction of light is formed.

6 Claims, 17 Drawing Sheets

F I G. 4
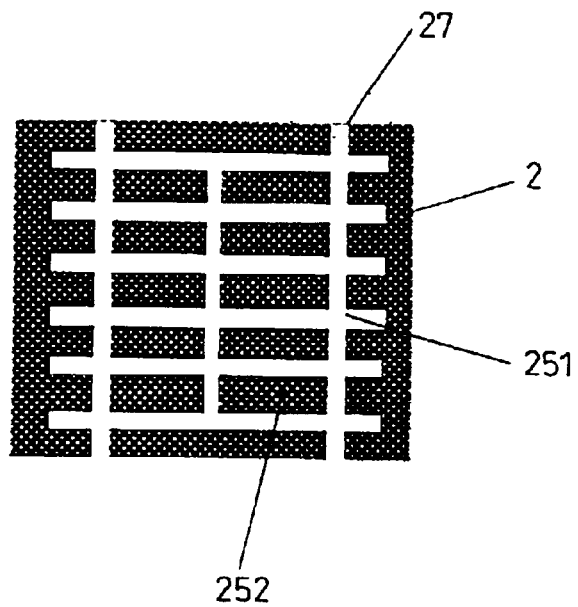
F I G. 5
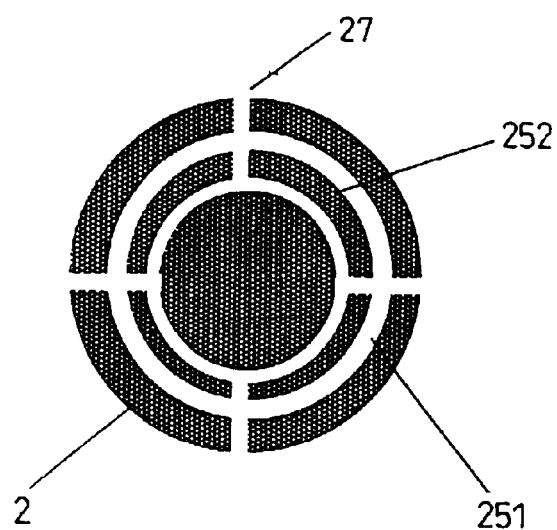

F I G. 8 A
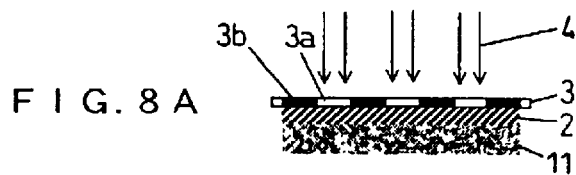
F I G. 8 B
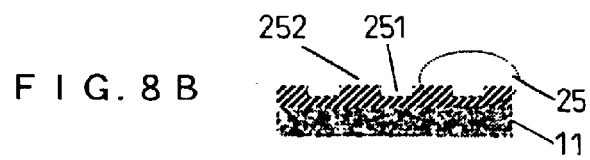
F I G. 8 C
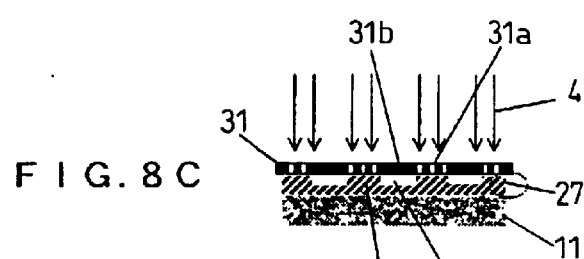
F I G. 8 D
F I G. 8 E
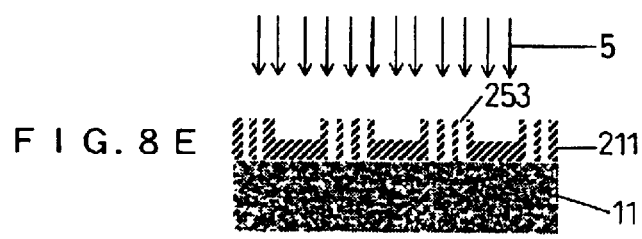
F I G. 8 F
F I G. 8 G
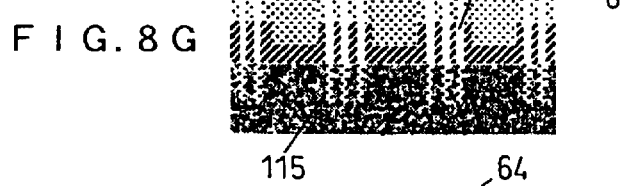
F I G. 8 H

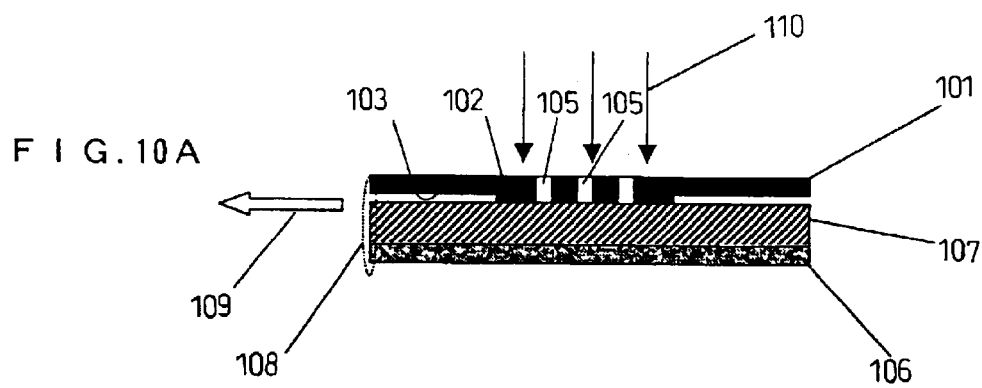
F I G. 10 A
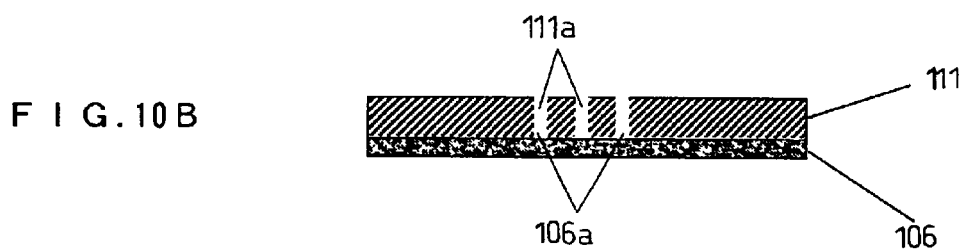
F I G. 10 B
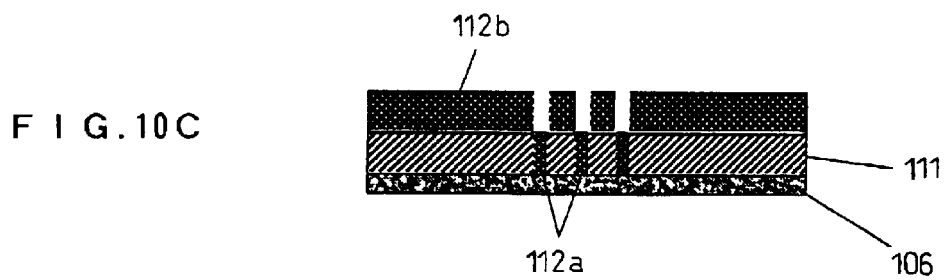
F I G. 10 C
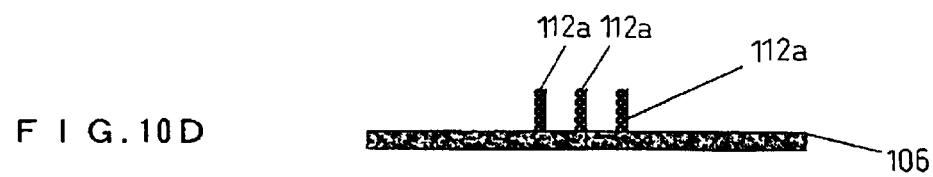
F I G. 10 D

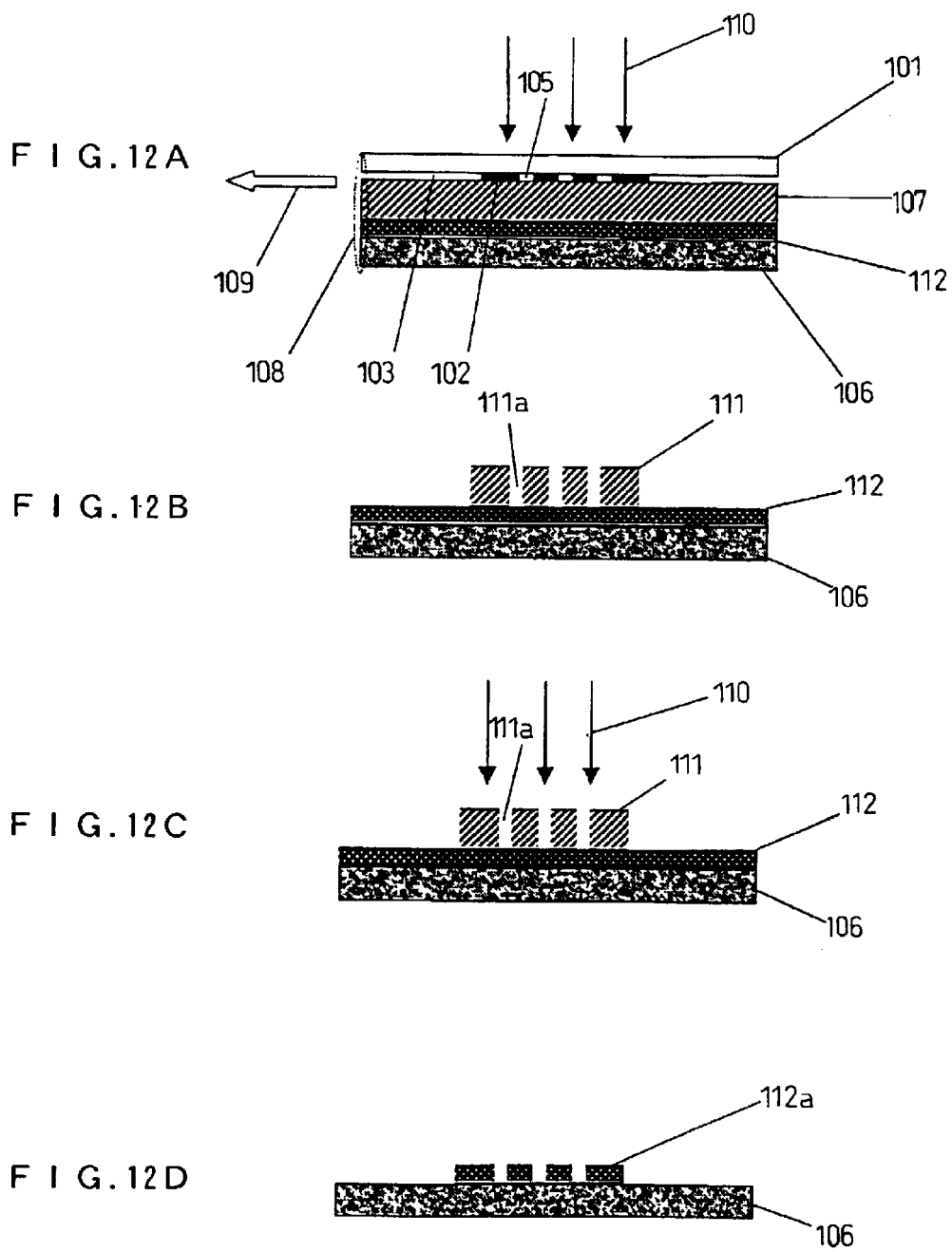

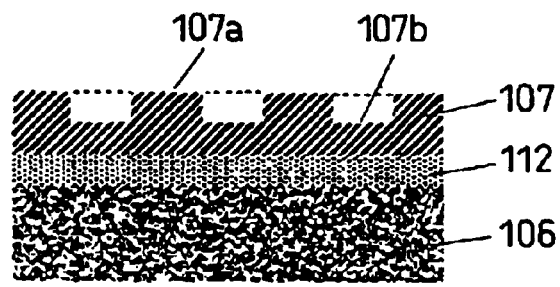
F I G. 13 A
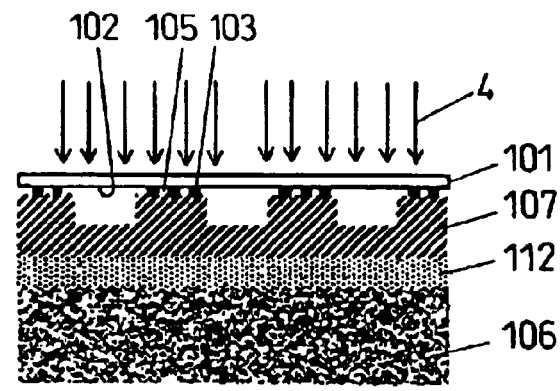
F I G. 13 B
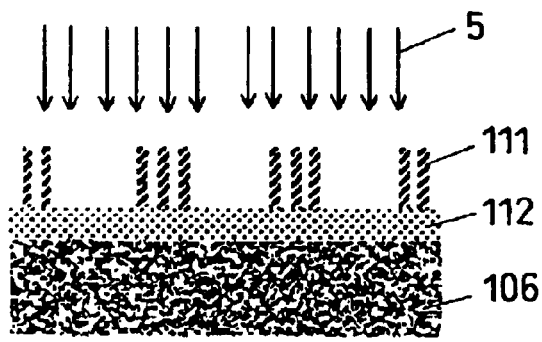
F I G. 13 C
F I G. 13 D F I G. 15
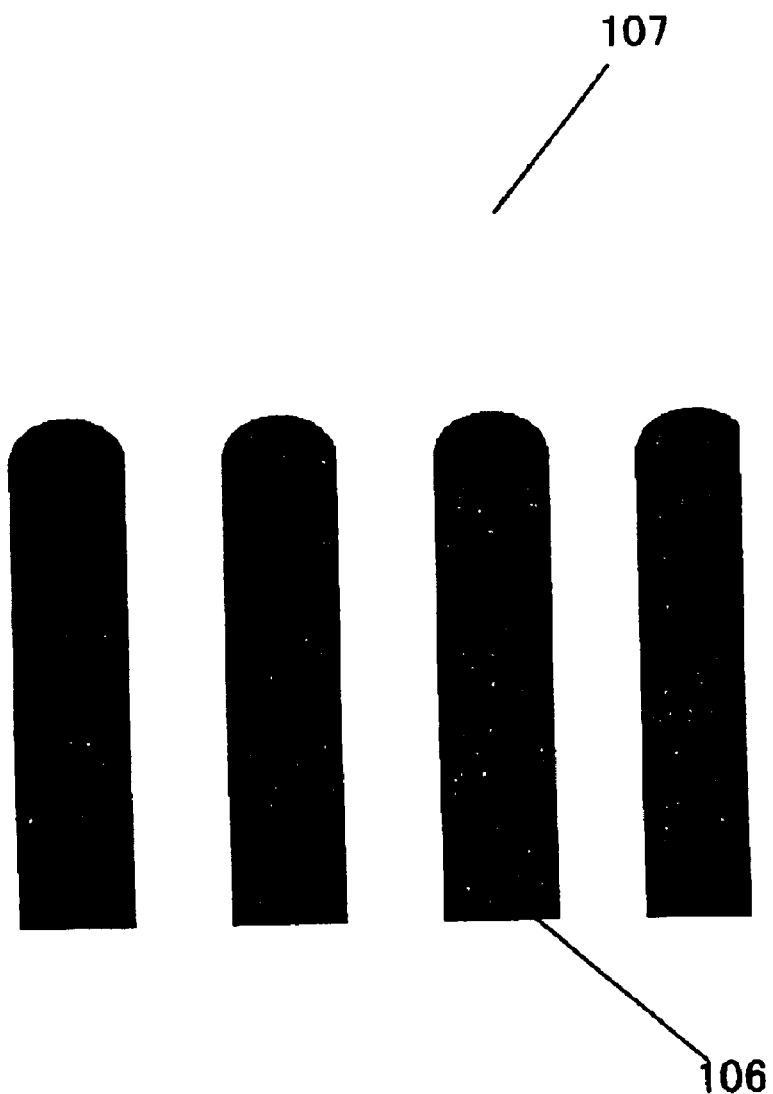

PHOTOMASK, METHOD OF GENERATING RESIST PATTERN, AND METHOD OF FABRICATING MASTER INFORMATION CARRIER

BACKGROUND OF THE INVENTION

1. Field of the Invention

The present invention relates to a photomask, a method of generating a resist pattern, and a method of fabricating a master information carrier for magnetically transferring an information signal onto a magnetic recording medium.

2. Description of the Related Art

At present, in order to realize smaller size and larger capacity, the recording density of a hard disk drive and other magnetic recording and reproducing apparatuses is increasing. To realize such a high recording density, the tracking servo technique of a magnetic head for recording and reproduction plays an important role. In the present tracking servo technique, information signals such as a tracking servo signal, an address signal, and a clock signal are preformat-recorded on a magnetic recording medium. A magnetic head reproduces the information signals and scans tracks accurately while confirming and correcting the position of itself. The information signals are signals used as references so that the magnetic head can scan tracks accurately. The information signals are requested to be accurately positioned and preformat-recorded on a magnetic recording medium. One of techniques for preformat-recording such information signals on a magnetic recording medium have been disclosed in Japanese Unexamined Patent Application No. 10-40544. According to the technique, the surface of a magnetic recording medium onto which information signals are to be recorded is made come into contact with the surface of a master information carrier on which a ferromagnetic thin film is formed in a pattern corresponding to information signals, and the information signals are magnetically transferred in a lump from the master information carrier onto the magnetic recording medium.

On the master information carrier used for magnetically transferring information signals onto the magnetic recording medium as described above, a pattern of a ferromagnetic thin film has to be formed in correspondence with information signals with high precision. In a method of fabricating such a master information carrier, as shown in FIG. 16A, conventionally, a resist film 2 is formed on a non-magnetic substrate 11. By evacuation 7 of air existing between the contact face of a photomask 3 and the contact face of the resist film 2, the contact faces are made come into close contact to each other. After that, the resist film 2 is irradiated with ultraviolet rays as exposure light 4 and developed, thereby generating a predetermined resist pattern 21 shown in FIG. 16B. Further, as shown in FIG. 16C, a ferromagnetic thin film 6 is formed on the resist pattern 21 and a substrate exposed face 12 and, as shown in FIG. 16D, a ferromagnetic thin film pattern 63 is generated by the lift off method.

In the conventional method, as shown in FIG. 17, particularly air in the center area hardly escapes. It causes an air gap 8 between the resist film 2 and the photomask 3 and the pattern shape varies due to diffraction 41 of the irradiated exposure light 4. For example, as shown in FIGS. 18A to 18D, in the conventional method, the resist pattern 21 has a side-wall taper 22 caused by the diffraction 41 of the exposure light 4. At the time of removing the ferromagnetic thin film 6 by the lift off method, the side-wall taper 22 causes a burror debris 61 in the side wall. As the pattern line width is becoming narrower, as shown in FIGS. 19A and 19B, the resist film 2 covered with the photomask 3 is exposed to the diffraction 41 of the exposure light 4. No pattern is generated after development, and the exposed face 12 appears in a part of the non-magnetic substrate 11.

SUMMARY OF THE INVENTION

Therefore, a main object of the present invention is to provide a resist pattern generating method useful for generating a resist pattern onto not limited to a master information carrier but the surface of a substrate widely and generally.

Another object of the invention is to provide a method of fabricating a master information carrier used for preformat-recording information signals onto a magnetic recording medium by magnetic transfer, capable of generating a ferromagnetic thin film pattern corresponding to information signals with high precision.

Other objects, features, and advantages of the invention will become apparent from the following description.

The invention is summarized as follows. A resist pattern generating method includes a first step of forming a resist film on the surface of a substrate, a second step of forming a recess for deaeration in an area where no pattern is generated and forming a projection for close contact in a pattern generating area in the surface of the resist film, a third step of making a photomask come into contact with the projection in the resist film and performing deaeration between the photomask and the resist film via the recess so as to bring the photomask and the projection into close contact, and a fourth step of irradiating the photomask with exposure light in the close contact state to expose the surface of said projection formed on said resist film to light in correspondence with a pattern shape.

According to the invention, the recess is preliminarily formed in the surface of the resist film and deaeration such as evacuation is performed via the recess at the time of pattern exposure, thereby enabling the close contact between the surface of the pattern forming area as the projection and the photomask to be made sufficiently strong. Thus, the resist pattern can be formed with precision while preventing diffraction of exposure light.

In the invention, preferably, in the second step, a plurality of recesses for deaeration are formed so as to be connected to each other in a peripheral area of the resist film.

In the invention, preferably, an almost disc-shaped substrate is used as the above-described substrate, and recesses for deaeration are formed almost radially so as to extend from a center area of the resist film to the peripheral area.

BRIEF DESCRIPTION OF THE DRAWINGS

These and other objects as well as advantages of the invention will become clear by the following description of preferred embodiments of the invention with reference to the accompanying drawings, wherein:

FIG. 4 is a plan view of a pattern in the case of applying the resist pattern generating method according to the first embodiment to a method of fabricatinairemiconductor chip;

FIG. 5 is a plan view of a pattern in the case of applying the resist pattern generating method according to the first embodiment to a method of fabricatinairpiral coil;

FIGS. 8A to 8H are process drawings showing a method of fabricating a master information carrier according to a third preferred embodiment of the invention;

FIGS. 10A to 10D are process drawings used for explaining a method of generating a resist pattern by using the photomask of FIG. 9 and a method of fabricating a master information carrier;

FIGS. 12A to 12D are process drawings used for explaining another method of generating a resist pattern by using another photomask and another method of fabricating a master information carrier according to a fifth preferred embodiment of the invention;

FIGS. 13A to 13D are process drawings used for explaining another method of generating a resist pattern by using another photomask and another method of fabricating a master information carrier in accordance with a sixth preferred embodiment of the invention;

FIG. 15 is an enlarged plan view of a part of a resist pattern obtained by using a photomask according to the embodiments of the invention;

DETAILED DESCRIPTION OF PREFERRED EMBODIMENTS

First Embodiment

Figure 1:
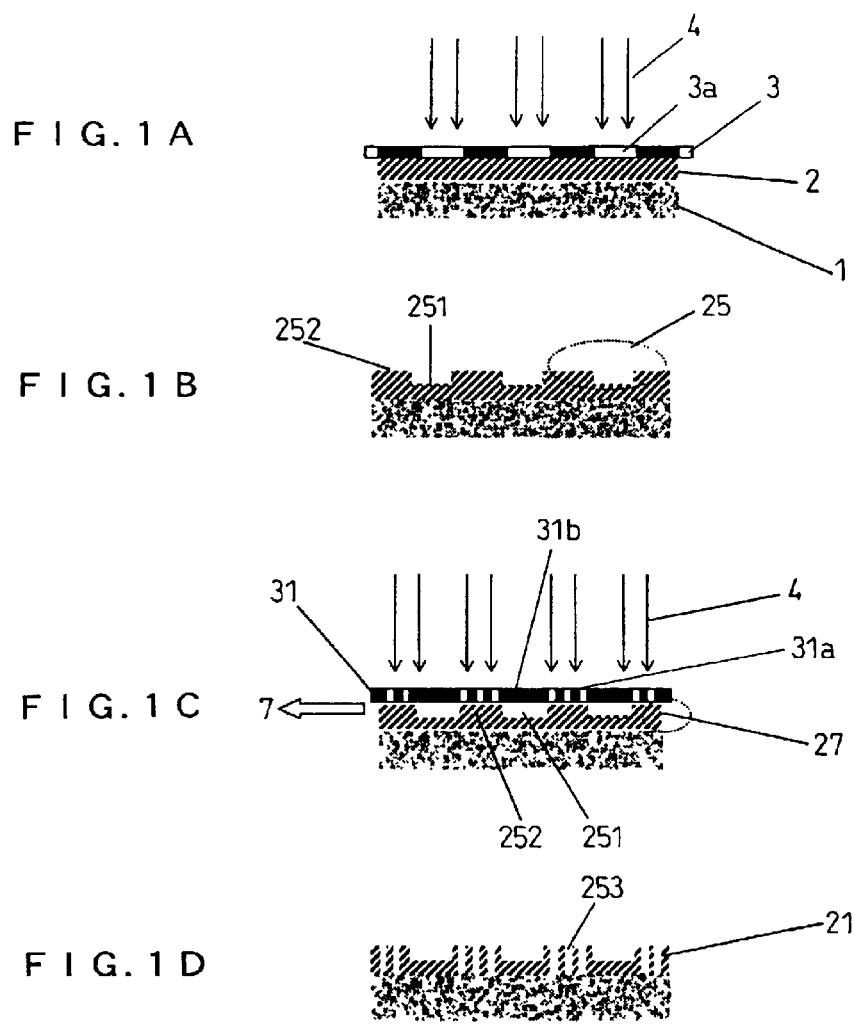
FIGS. 1A to 1D are process drawings in a resist pattern generating method according to a first preferred embodiment of the invention.

With reference to FIGS. 1A to 1D and FIG. 2, a resist pattern generating method according to a first preferred embodiment of the invention will be described. First, as shown in FIG. 1A, a resist film 2 is formed on a substrate 1. The resist film 2 may be formed by a normal method. For example, it is also possible to form the resist film 2 by spin-coating a resist and baking the resist at a low temperature. After that, by using the photolithography technique, the resist film 2 is exposed to exposure light 4 of a critical exposure amount (Et) or less by using a photomask 3, and developed.

By the above operation, as shown in FIG. 1B, projection and recess 25 are formed in the surface of the resist. Specifically, the photomask 3 is placed on the resist film 2 so as to make a light transmitting part 3a of the photomask 3 correspond to the position of an area in which no pattern is generated in the resist film 2, and the resist film 2 is exposed to the exposure light 4. After the exposure, development is carried out, thereby generating a recess 251 for deaeration in the surface of the resist film 2. On both sides of the recess 251 for deaeration, there are projections 252 for close contact as pattern generation areas. The recess 251 for deaeration is bottomed, that is, the surface of the substrate is not exposed at this portion.

Figure 2:
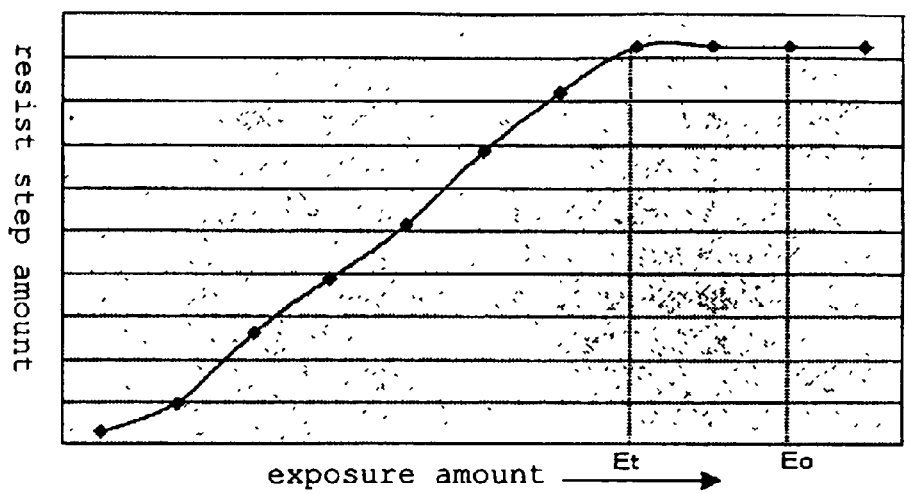
FIG. 2 is an explanatory diagram showing dependency on an exposure amount of a resist step amount in the first embodiment.

A resist step amount (an amount of a step between the recess and the projection) is almost proportional to the exposure amount as shown in FIG. 2. With an exposure amount smaller than the critical exposure amount (Et) with respect to the resist film thickness, the resist remains on the substrate 1. With an exposure amount larger than the critical exposure amount (Et), a step corresponding to the resist film thickness is formed.

Next, as shown in FIG. 1C, a photomask 31 in which a predetermined pattern is formed is allowed to come into contact with the surface of the resist film 2. Specifically, a light transmitting area 31a in a predetermined pattern in the photomask 31 is made come into contact with the projection 252 for close contact, and the area of the recess 251 for deaeration is covered with a light blocking area 31b in the photomask 31.

Subsequently, a seal is provided between a substrate holder (not shown) and the photomask 31. Further, evacuation 7 is performed from the periphery of the resist film 2. By the operation, as shown in FIG. 1C, the contact face of the photomask 31 and that of the projection 252 are brought into close contact to each other, the resist film 2 is exposed to the exposure light 4 of the optimum exposure amount (Eo). After development, a resist pattern 21 is generated as shown in FIG. 1D. In this case, since the evacuation 7 is performed via the recess 251 for deaeration, the close contact of the photomask 31 to the projection 252 becomes sufficiently strong.

As a result, diffraction of the exposure light 4 is prevented at the time of exposure in FIG. 1C, so that problems such as variations in the shape of the resist pattern 21 and generation of no pattern can be avoided. Consequently, the precision of formation of recesses 253 becomes sufficiently high and the resist pattern 21 can be formed with precision.

Figure 3:
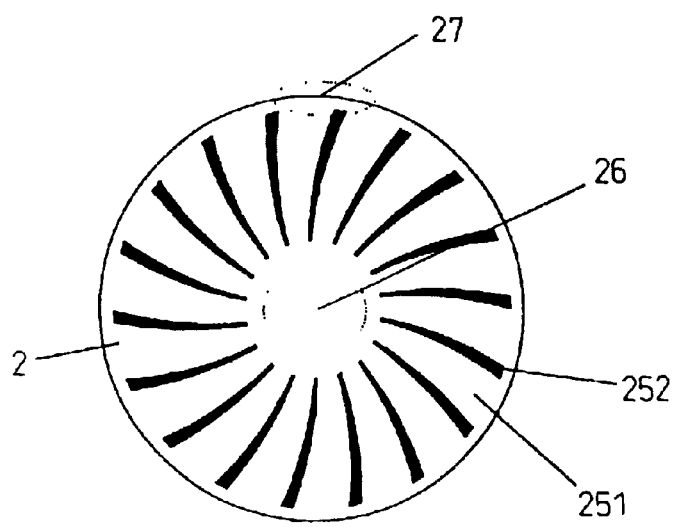
FIG. 3 is a plan view of a pattern in the case of applying the resist pattern generating method according to the first embodiment to a method of fabricating a master information carrier.

Referring to FIG. 3, an example of applying the resist pattern generating method of the invention to fabrication of a master information carrier will be described. In a master information carrier as an example in the embodiment, projected areas and recessed areas extending almost radially from a center area of a non-magnetic substrate surface (transfer face) to the peripheral area are provided so as to be adjacent to each other in the circumferential direction. In the projected area, a ferromagnetic thin film pattern is provided in a shape pattern corresponding to information signals. In the embodiment, the master information carrier takes the form of a disk for magnetically transferring an information signal to a magnetic recording medium. The shape of the master information carrier in the invention is not limited to a disk shape but includes a polygonal shape, a tape shape, and so on in accordance with the purpose and use of the transfer. The magnetic recording medium in the embodiment is a disk. On one face (receiving face) of the disk, a pattern corresponding to information signals is magnetically transferred from a master information carrier. The shape of the magnetic recording medium in the invention is not limited to a disk shape but includes a polygonal shape, a tape shape, and so on in accordance with the purpose and use of the transfer. A ferromagnetic thin film pattern on the transfer face of a master information carrier is brought into close contact with the receiving face of the magnetic recording medium, and magnetic transfer is carried out.

As the materials of a ferromagnetic thin film, various kinds of magnetic materials can be used irrespective of a hard magnetic material, a semi-hard magnetic material, and a soft magnetic material as lonair an information signal can be transferred and recorded onto a magnetic recording medium. For example, Fe, Co, Fe—Co alloy, Ni—Fe alloy, and the like can be used.

First, a plurality of recesses 251 for deaeration are formed in the resist film 2 by using the photolithography technique. The recesses 251 for deaeration are formed almost radially so as to extend from a center area 26 of the resist film 2 toward a peripheral area 27. The plurality of recesses 251 for deaeration are connected to each other in the peripheral area of the resist film 2.

After that, the photomask 31 (not shown in FIG. 3) corresponding to the information signal pattern is allowed to come into contact with the surface of the projections 252 in the resist film 2. In the contact state, by performing deaeration from the peripheral area 27 of the resist film 2 by evacuation, the contact face of the photomask 31 and that of the projections 252 are brought into close contact to each other. Exposure is performed in the contact state and, after that, development is conducted. By the operations, the predetermined resist pattern 21 (not shown in FIG. 3) is formed on the projections 252.

Referring to FIGS. 4 and 5, examples of applying the resist pattern generating method of the invention to other fabrication will be described. Each of FIGS. 4 and 5 shows a state where the plurality of recesses 251 exist in the resist film 2 and are connected to each other and, by performing evacuation from the peripheral portion 27 of the resist film 2, the photomask 31 (not shown in FIGS. 4 and 5) and the projections 252 are brought into close contact, and exposure is performed. The case of FIG. 4 is suitable for exposure of, for example, an array of the same chip patterns such as a semiconductor chip or a thin film magnetic head. The case of FIG. 5 is suitable for exposure of, for example, an almost circular pattern such as a spiral coil used for a thin film magnetic head.

As described above, the resist pattern generating method of the invention is not limited to the method of fabricating a master information carrier but can be applied to other fields in various embodiments.

According to the foregoing first embodiment, air such as air existing between the photomask 31 and the resist film 2 can be easily evacuated via the recesses 251 for deaeration in the resist film 2, so that the close contact between the photomask 31 and the projections 252 can be improved. Thus, as shown in FIG. 1D, the resist pattern 21 in which, as a required pattern, the recesses 253 each having a side wall face perpendicular to the substrate 1 are formed can be obtained.

Figure 6:
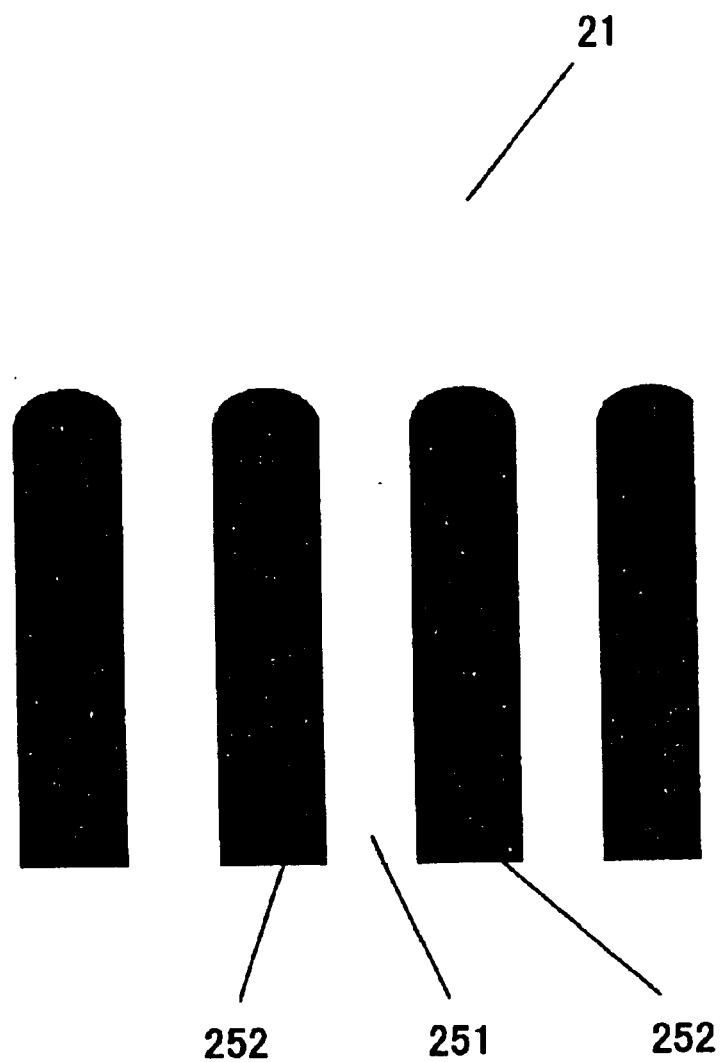
FIG. 6 is an enlarged plan view of a part of a resist pattern generated by the resist pattern generating method according to the first embodiment.

FIG. 6 is an enlarged plan view of a part of the excellently generated resist pattern 21.

Second Embodiment

Figure 7A:
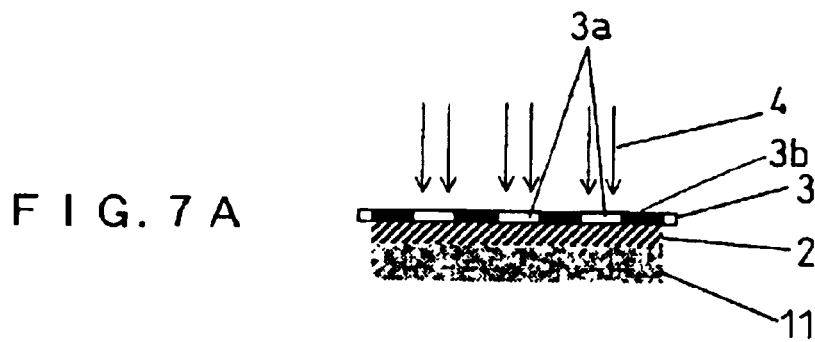
FIGS. 7A to 7F are process drawings showing a method of fabricating a master information carrier according to a second preferred embodiment of the invention.
Figure 7B:
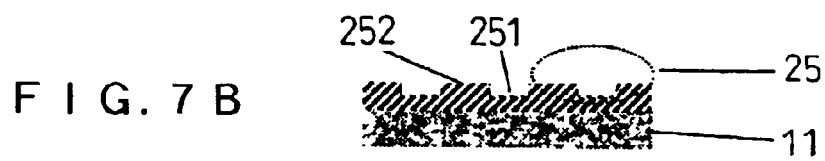
Figure 7C:
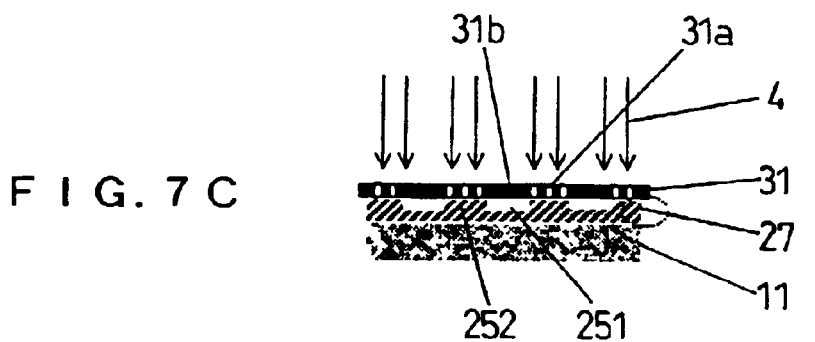
Figure 7D:
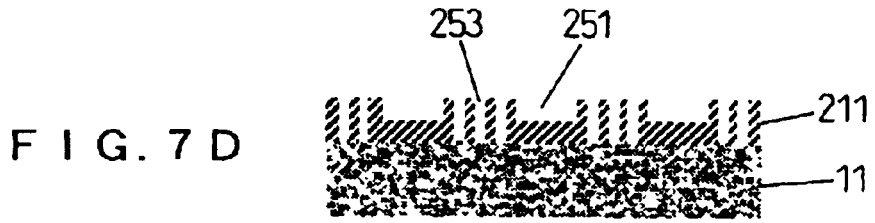
Figure 7E:
Figure 7F:

Referring to FIGS. 7A to 7F, a method of fabricating a master information carrier according to a second preferred embodiment of the invention will be described. First, as shown in FIG. 7A, a resist is applied on the surface of a disc-shaped non-magnetic substrate 11 to form the resist film 2. Then, the photomask 3 is placed on the surface of the resist film 2 in such a manner that the light blocking parts 3b in the photomask 3 correspond to the pattern generating area in the resist film 2. Further, by using the photolithography technique, the resist film 2 is exposed to the exposure light 4 via the light transmitting parts 3a in the photomask 3. After the exposure, development is carried out. By the operation, the projection and recess 25 are formed in the surface of the resist film 2 as shown in FIG. 7B. Subsequently, the photomask 3 is removed as shown in FIG. 7B. The projection and recess 25 are constructed by the recess 251 for deaeration (pattern not-generating area) corresponding to the light transmitting part 3a in the photomask 3 and the projection 252 for close contact (pattern generating area) corresponding to the light blocking part 3b in the photomask 3. The recesses 251 for deaeration are formed on both sides or around the projection 252 for close contact. As shown in FIG. 7C, the resist film 2 is covered with the photomask 31 in which the light transmitting part 31a is formed. The light transmitting parts 31a correspond to a pattern of information signals for tracking servo or the like to be magnetically transferred onto the magnetic recording medium. Specifically, the light transmitting parts 31a in the photomask 31 are allowed to come into contact with the surface of the projections 252 for close contact in the resist film 2, and the light blocking parts 31b in the photomask 31 are positioned to the recesses 251 for deaeration. In this state, the resist film 2 is covered with the photomask 31. Subsequently, air is evacuated from the peripheral portion 27 in the resist film 2 via the recesses 251 for deaeration. Thus , the photomask 31 and the projections 252 come into close contact to each other. In the close contact state, exposure is performed with the exposure light 4. After the exposure, development is carried out. By the operations, the resist pattern 211 corresponding to the information signal is formed in the resist film 2. FIG. 7D shows the state. In correspondence with the positions of the light transmitting parts 31a in the photomask 31, the recesses 253 in the required pattern shape showing the information signal are formed in the resist film 2. On the bottom of each recess 253, the surface of the non-magnetic substrate 11 is exposed. As shown in FIG. 7E, a ferromagnetic thin film 6 is deposited on the non-magnetic substrate 11 via the recesses 253. Concretely, by depositing the ferromagnetic thin film 6 on the surface of the resist film 2 which is the resist pattern 211, the ferromagnetic thin film 6 is allowed to enter also in the recesses 253 so as to be deposited also on the surface of the non-magnetic substrate 11. Subsequently, the ferromagnetic thin film 6 deposited on the resist pattern 211 is removed with an organic solvent by the lift-off method to thereby generate a ferromagnetic thin film pattern 63 corresponding to the information signals as shown in FIG. 7F.

By the above operations, the master information carrier in which the ferromagnetic thin film pattern 63 corresponding to the information signals is formed on the non-magnetic substrate 11 is fabricated.

According to the second embodiment, in a state where the close contact between the projections 252 for close contact and the photomask 31 is enhanced by performing evacuation through the recesses 251 for deaeration, the resist film 2 is exposed to generate a pattern. Thus, diffraction of light in the exposure for generating a pattern can be prevented with reliability. As the resist pattern 211, a resist pattern having the recesses 253 each having a side wall face free from a taper perpendicular to the surface of the non-magnetic substrate 11 can be generated. As a result, the master information carrier having high pattern precision free from problems such as variations in the pattern shape and generation of no pattern as recognized in the conventional technique can be fabricated.

Third Embodiment

Referring to FIGS. 8A to 8H, a method of fabricating a master information carrier according to a third preferred embodiment of the invention will be described. Since the processes of FIGS. 8A to 8D are the same as those of FIGS. 7A to 7D, their description will not be repeated. As shown in FIG. 8E, the resist pattern 211 formed on the surface of the disc-shaped non-magnetic substrate 11 is used as an etching mask, and etching 5 is performed on the non-magnetic substrate 11 via the recesses 253 in the resist pattern 211. By the operation, as shown in FIG. 8F, recesses 115 for embedding corresponding to the information signals are formed in the surface of the non-magnetic substrate 11 in correspondence with the position of the recesses 253 in the resist pattern 211. As shown in FIG. 8G, the ferromagnetic thin film 6 is embedded in the recesses 115 for embedding in the non-magnetic substrate 11 via the recesses 253. Concretely, by depositing the ferromagnetic thin film 6 on the surface of the resist film 2 which is the resist pattern 211, the ferromagnetic thin film 6 is allowed to enter also in the recesses 253, thereby embedding the ferromagnetic thin film 6 in the recesses 115 for embedding in the surface of the non-magnetic substrate 11. As shown in FIG. 8H, the ferromagnetic thin film 6 deposited on the resist pattern 211 is removed with an organic solvent by the lift off method, thereby generating a ferromagnetic thin film pattern 64 corresponding to the information signals in a state where it is embedded in the non-magnetic substrate 11. By the above operations, the master information carrier in which the ferromagnetic thin film pattern 64 corresponding to the information signals is embedded in the surface of the non-magnetic substrate 11 is fabricated.

According to the third embodiment, in a manner similar to the second embodiment, in a state where the close contact between the projections 252 for close contact and the photomask 31 is enhanced by deaeration through evacuation of the air via the recesses 251 for deaeration, the resist film 2 is exposed to light in the pattern. Therefore, diffraction of the exposure light can be prevented with reliability, and the master information carrier having high pattern precision free from problems such as variations in the pattern shape and generation of no pattern can be fabricated. Further, since the ferromagnetic thin film pattern 64 corresponding to information signals is generated in a state where it is embedded in the non-magnetic substrate 11, a long-life master information carrier can be provided.

In an experiment carried out by the inventors herein, a resist film was spin-coated on a substrate to a thickness of about 1 μm and soft-baked on a hot plate of 90° C. for one minute. After that, the surface of the resist film was partly exposed to light at an irradiation power of 10 mW/cm² for two to four seconds, and development was performed, thereby forming projections and recesses in the resist having a step amount of about 0.1 to 0.5 μm. Subsequently, the photomask in which a predetermined pattern is formed and the projections in the resist were allowed to be brought into close contact to each other by evacuation, and exposure was performed with light of an optimum exposure amount corresponding to a resist film thickness of 1 μm. After the exposure, development was carried out. As a result, a resist pattern in a good shape also in a line width in a submicron area can be obtained.

Information signals were preformat-recorded onto a magnetic recording medium by using a master information carrier fabricated by the method of the foregoing embodiment. After that, by reading the information signals recorded on the magnetic recording medium by using a head, the information signals were evaluated. As a result, it was recognized that the information signals as designed including a fine line having a pattern line width of 0.5 μm were recorded. On the other hand, in evaluation performed by using the master generated according to the conventional method shown in FIGS. 16A to 16D, when a line is narrowed to 0.7 μm, a reproduction signal as designed could not be obtained.

Fourth Embodiment

In the foregoing first to third embodiments, the recesses 251 for deaeration and the projections 252 for close contact are formed in the resist film 2. The necessity of forming such recesses 251 for deaeration and the projections 252 for close contact in the resist film 2 can be eliminated by changing the shape of a photomask.

Figure 9:
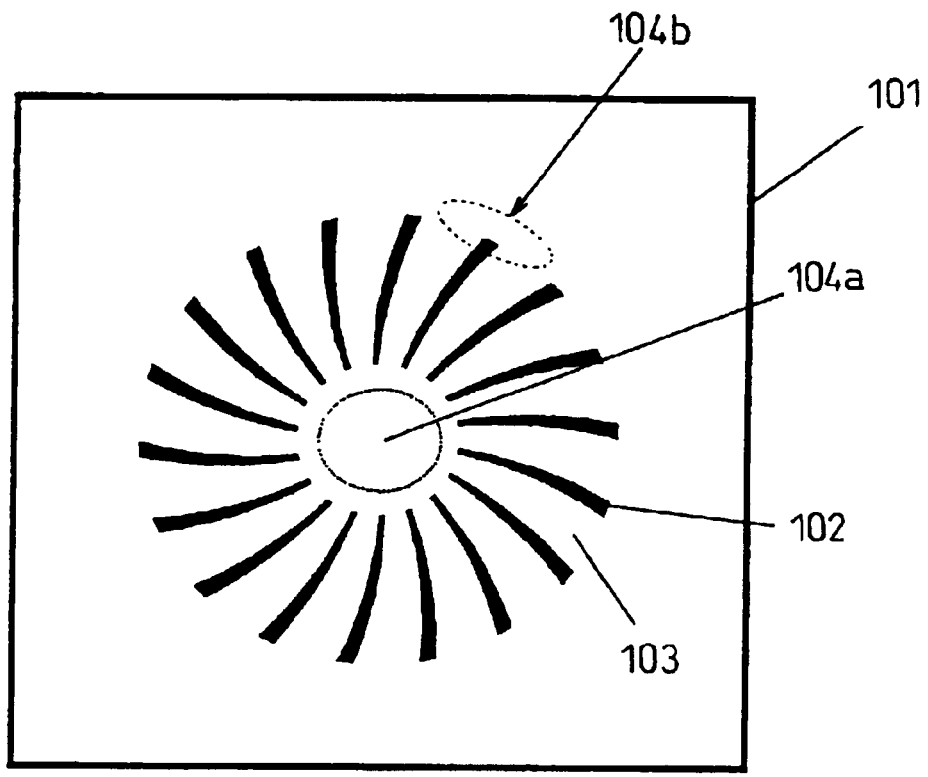
FIG. 9 is a plan view of a photomask according to a fourth preferred embodiment of the invention.

With reference to FIG. 9 and FIGS. 10A to 10D, such a photomask, a resist pattern generating method using the photomask, and a master information carrier fabricating method will be described hereinbelow. FIG. 9 is a plan view showing the back side of the photomask. FIG. 10A is an enlarged sectional side view of a peripheral area 104b in FIG. 9. A photomask 101 is made of a material which does not transmit exposure light.

The photomask 101 has a flat surface on which the exposure light 110 falls, and includes, on its rear face as the side opposite to the exposure light 110, a plurality of projections 102 for close contact and a plurality of recesses 103 for deaeration used to evacuate air existing between the rear face side of the photomask 101 and the surface of a resist to the outside at the time of the close contact. The recesses 103 for deaeration are provided almost radially so as to extend from the center area 104a of photomask 101 toward the peripheral area 104b and are connected to each other. The projections 102 for close contact are formed so as to surround light transmitting portions 105 which allow passage of the exposure light 110. The light transmitting portions 105 in this case are formed in a pattern corresponding to information signals. The projections 102 for close contact and recesses 103 for deaeration are provided so as to be adjacent to each other in the circumferential direction so as to extend from the center area 104a of the photomask 101 to the peripheral area 104b almost radially.

A method of fabricating a master information carrier by using the photomask 101 will be described. First, as shown in FIG. 10A, a resist is spin-coated on the surface of a non-magnetic substrate 106 and subjected to a low-temperature baking process, thereby forming a resist film 107 on the surface of the non-magnetic substrate 106. Subsequently, the photomask 101 is placed on the surface of the resist mask 107. By performing evacuation 109 of air from an outer periphery 108 of the photomask 101 and non-magnetic substrate 106, air existing between the rear face side of the photomask 101 and the resist film 107 on the surface of the non-magnetic substrate 106 is deaerated to the outside to form a negative pressure with respect to the atmospheric pressure between them. Consequently, the projections 102 for close contact on the rear face side of the photomask 101 and the surface of the resist film 107 are brought into close contact to each other. Subsequently, by irradiating the photomask 101 with the exposure light 110 of an optimally set exposure amount, the surface of the resist film 107 is exposed in the pattern shape of the light transmitting portions 105 in the photomask 101. Development is carried out by using the difference between the solubility of the exposed part in the resist film 107 and that of the not-exposed part with respect to the developer, thereby removing the resist film 107 exposed to the exposure light 110 from the surface of the non-magnetic substrate 106. By the operation, as shown in FIG. 10B, a desired resist pattern 111 is formed on the surface of the non-magnetic substrate 106. In the resist pattern 111, windows 111a corresponding to the pattern shape of the light transmitting portions 105 are opened, and portions 106a in the surface of the non-magnetic substrate 106 corresponding to the windows 111a are exposed. FIG. 15 is an enlarged plan view of a part of a resist pattern obtained by using a photomask according to the embodiments of the invention. Subsequently, as shown in FIG. 10C, ferromagnetic thin films 112a and 112b are formed on the surface exposed portions 106a in the non-magnetic substrate 106 and the resist pattern 111. The ferromagnetic thin film 112a is formed on the surface exposed portions 106a, and the ferromagnetic thin film 112b is formed on the resist pattern 111. As shown in FIG. 10D, the ferromagnetic thin film 112b on the resist pattern 111 is removed by using an organic solvent. In such a manner, the master information carrier having the ferromagnetic thin film pattern 112a on the surface exposed portions 106a can be fabricated.

In an experiment carried out by the inventors herein, the resist film 107 was spin-coated on the non-magnetic substrate 106 to a thickness of about 1 $\mu$m and soft-baked on a hot plate of 90° C. for one minute, the photomask 101 having a step amount of about 0.1 to 0.5 $\mu$m on which a predetermined pattern is mounted on the projections 102 for close contact and the surface of the resist film 107 were brought into close contact to each other by evacuation, and exposure and development were carried out. As a result, it was recognized that the resist pattern 111 in a good shape also in a line width in a submicron area could be obtained.

Digital signals were magnetically transferred onto a magnetic recording medium by using the master information carrier fabricated according to the foregoing fourth embodiment, and read with a head, thereby evaluating the signals. It was recognized that signals as designed are recorded also in a fine line having a pattern line width of 0.5 $\mu$m. On the other hand, in evaluation of signals obtained by using the master information carrier generated according to the conventional method, it was recognized that when the pattern line width was narrowed to 0.7 $\mu$m, reproduction signals as designed could not be obtained.

Figure 11A:
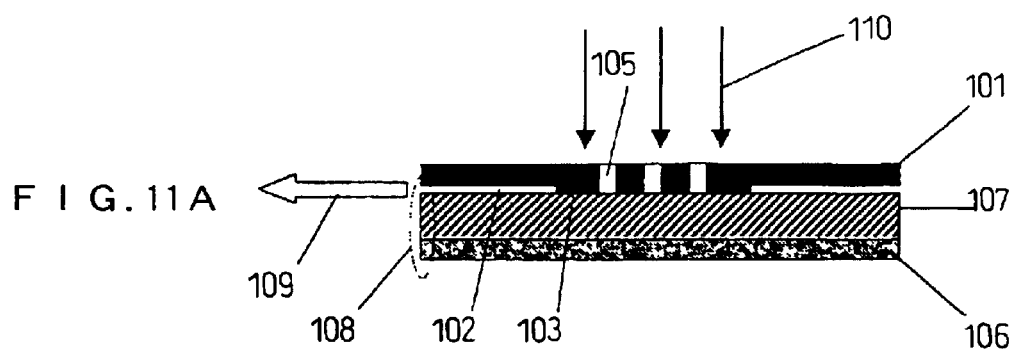
FIGS. 11A to 11E are process drawings used for explaining another method of generating a resist pattern by using the photomask of FIG. 9 and another method of fabricating a master information carrier.
Figure 11B:
Figure 11C:
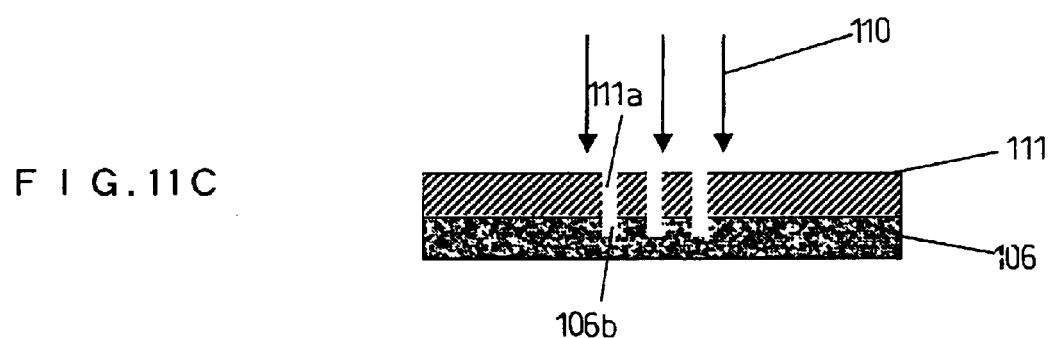
Figure 11D:
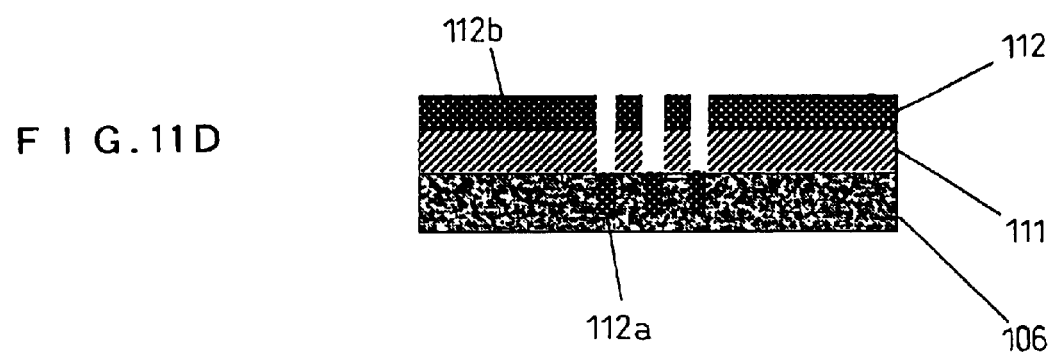
Figure 11E:

In the foregoing embodiment, in place of the fabricating process of FIG. 10C and subsequent processes, the fabricating process of FIG. 11C and subsequent processes may be performed. Since FIGS. 11A and 11B correspond to FIGS. 10A and 10B, respectively, their description will not be repeated. In the fabricating method shown in FIGS. 11A to 11E, the resist film 107 is exposed in FIG. 11A and, as shown in FIG. 11B, the exposed portion is removed to generate the resist pattern 111 and to expose the surface of the non-magnetic substrate 106. After FIG. 11B, as shown in FIG. 11C, the resist pattern 111 is used as an etching mask, and the non-magnetic substrate 106 is preliminarily etched through the windows 111a in the resist pattern 111 to thereby form holes 106b for embedding a ferromagnetic thin film having a required depth. As shown in FIG. 11D, the ferromagnetic thin films 112a and 112b are formed in the holes 106b in the non-magnetic substrate 106 and on the resist pattern 111. Subsequently, as shown in FIG. 11E, by removing the resist pattern 111 together with the ferromagnetic thin film 112b, the master information carrier having the structure in which the ferromagnetic thin film 112a is embedded in the holes 106b for embedding the ferromagnetic thin film in the non-magnetic substrate 106 can be fabricated.

Fifth Embodiment

With reference to FIGS. 12A to 12D, a photomask, a resist pattern generating method, and a method of fabricating a master information carrier by using it will be described. The photomask 101 used in the fifth embodiment is made of a material which transmits the exposure light 110 and has an even thickness as shown in FIG. 12A. The photomask 101 has a flat surface and, on its rear face, projections and recesses. In this case, on the rear face of the photomask 101, the plurality of projections 102 for close contact and the plurality of recesses 103 for deaeration are provided. At least one of the recesses 103 for deaeration is formed so as to extend to the periphery of the photomask 101, and the recesses 103 are connected to each other. The projection 102 for close contact itself is made of a material which does not transmit light. In the projection 102 for close contact, the light transmitting portion 105 which permits passage of the exposure light 110 is formed. In this case, the light transmitting portions 105 are formed in a pattern shape corresponding to desired information signals. Generation of a resist pattern and fabrication of a master information carrier will now be described. On the surface of the non-magnetic substrate 106, the ferromagnetic thin film 112 is preliminarily formed in a uniform thickness. First, as shown in FIG. 12A, the resist film 107 is spin-coated on the surface of the ferromagnetic thin film 112 in the non-magnetic substrate 106 and baked at low temperature. The photomask 101 is placed on the surface of the resist film 107. Subsequently, the space between the rear face of the photomask 101 and the surface of the ferromagnetic thin film 112 is sealed and evacuation 109 is performed from the outer periphery 108 of the non-magnetic substrate 106, thereby adhering the surface of the resist film 107 and the projections 102 for close contact of the photomask 101. In this close contact state, exposure is made by using the exposure light 110 of the optimally set exposure amount. Subsequently, by performing development, as shown in FIG. 12B, the exposed resist film 107 in the area other than the projections 102 for close contact is removed from the surface of the ferromagnetic thin film 112 to thereby form the required resist pattern 111 corresponding to the projections 102 for close contact on the surface of the ferromagnetic thin film 112. In the resist pattern 111, the windows 111a corresponding to the pattern of information signals are opened. Subsequently, as shown in FIG. 12C, out of the whole ferromagnetic thin film 112 on the surface of the non-magnetic substrate 106, the exposed ferromagnetic thin film 112 on which the resist pattern 111 does not exist is removed by etching such as reactive ion etching or ion milling, so that the ferromagnetic thin film 112a under the resist pattern 111 remains. As shown in FIG. 12D, by removing the resist pattern 111, the master information carrier having the pattern of the ferromagnetic thin film 112a can be fabricated.

Sixth Embodiment

Referring to FIGS. 13A to 13D, a method of fabricating a master information carrier according to a sixth embodiment will be described. The sixth embodiment is different from the fifth embodiment with respect to that, as shown in FIG. 13A, recesses 107b for deaeration and projections 107a for close contact are formed in the surface of the resist film 107 formed on the surface of the ferromagnetic thin film 6.

On such a resist film 107, as shown in FIG. 13B, the photomask 101 similar to that illustrated in FIG. 12A is placed. FIGS. 13A to 13D show the recesses 107b and projections 107a in the resist film 107 at a smaller magnification than that of FIGS. 12A to 12D.

The space between the rear face of the photomask 101 and the surface of the resist film 107 is sealed and evacuation is performed from the periphery of the non-magnetic substrate 106. In the evacuation, since the larger space for deaeration is assured by the recesses 107b for deaeration in the resist film 107 and the recesses 103 for deaeration in the photomask 101, deaeration can be performed more effectively as compared with the case of FIG. 12A. As a result, the surface of the resist film 107 and the photomask 101 are brought into close contact to each other more strongly by the deaeration. When exposure is performed by using the exposure light 4 of an optimally set exposure amount in the close contact state and the developing process is carried out, the exposed parts in the resist film 107 are removed while the not-exposed parts in the resist film 107 remain. Consequently, by the parts of the remaining resist film 107, the resist pattern 111 as shown in FIG. 13C is obtained. When the resist pattern 111 is used as a mask and etching 5 is performed, as shown in FIG. 13D, a master information carrier having the required ferromagnetic thin film pattern 112a on the surface of the non-magnetic substrate 106 can be fabricated.

According to the sixth embodiment, the master information carrier having high pattern precision free from problems such as variations in the pattern shape and generation of no pattern can be fabricated.

Figure 14A:
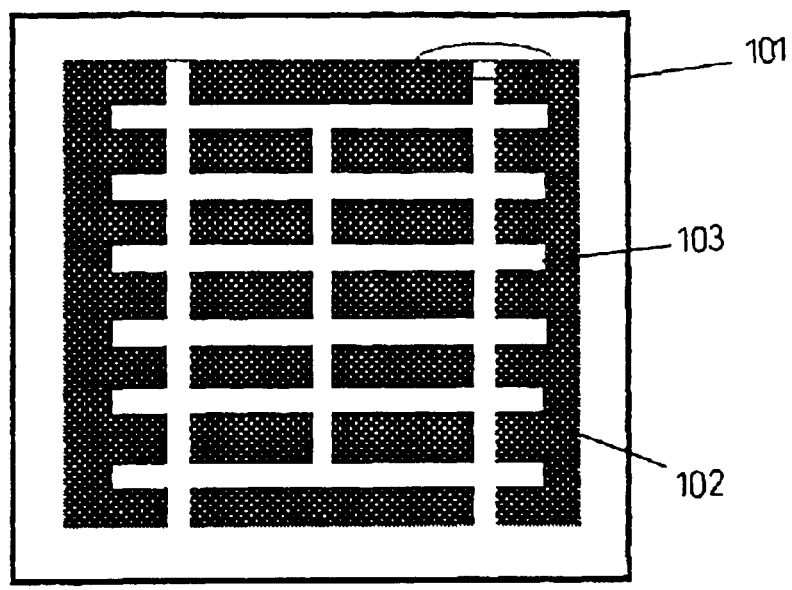
FIG. 14A is a plan view of further another photomask.
Figure 14B:
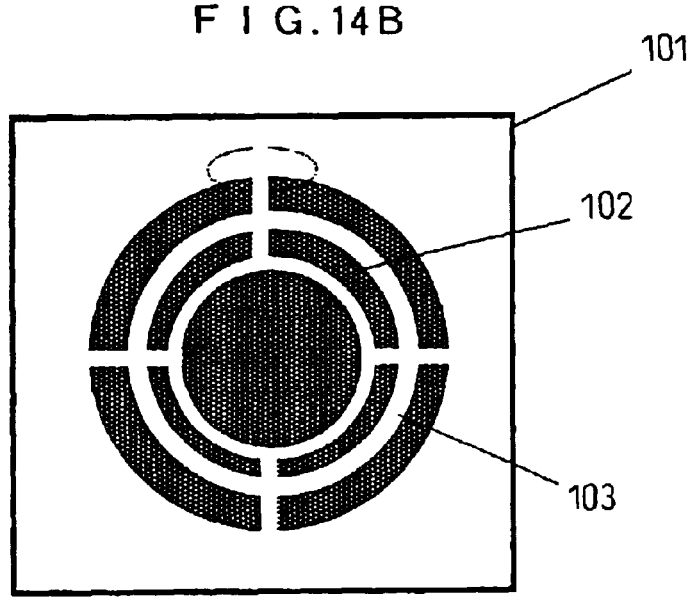
FIG. 14B is a plan view of further another photomask.
Figure 16A:
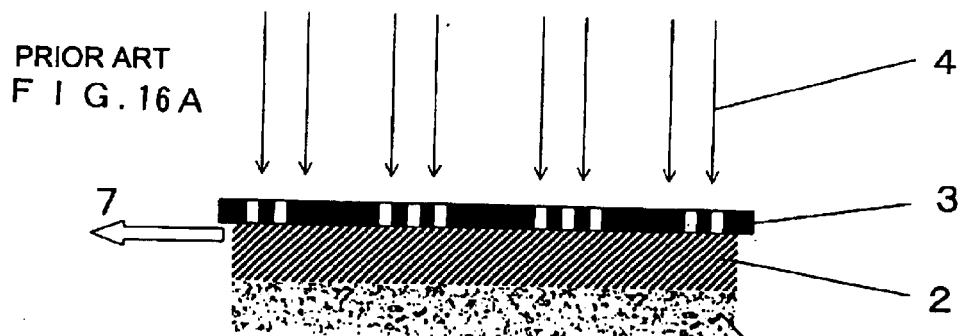
FIGS. 16A to 16D are process drawings of a conventional method of generating a resist pattern.
Figure 16B:
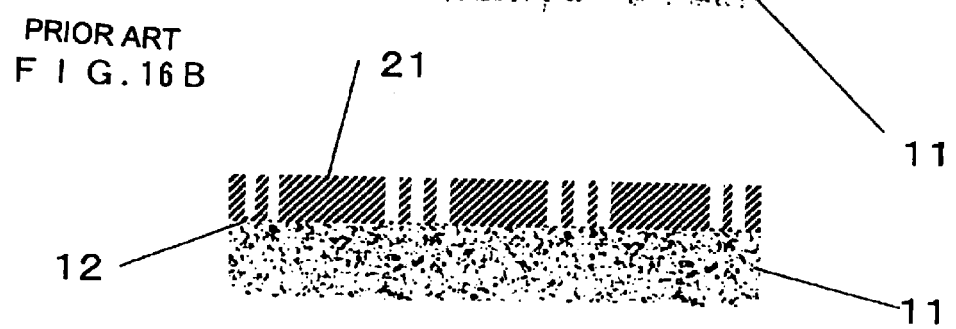
Figure 16C:
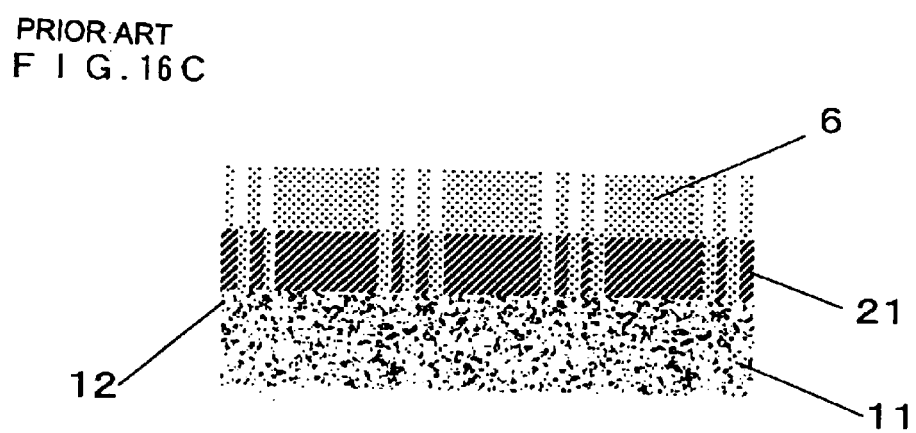
Figure 16D:
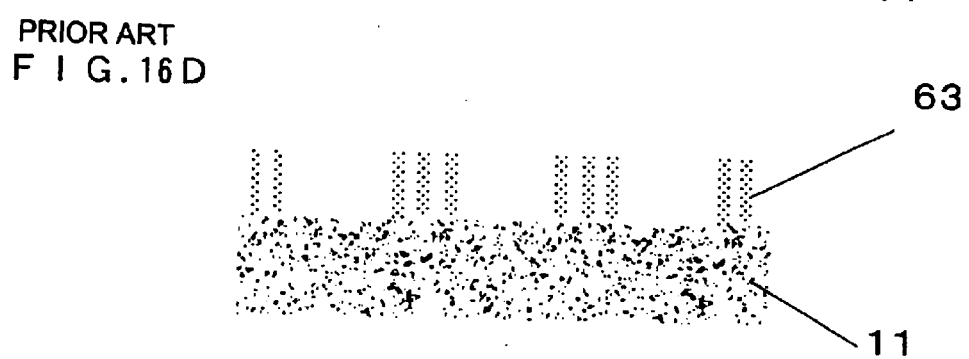
Figure 17:
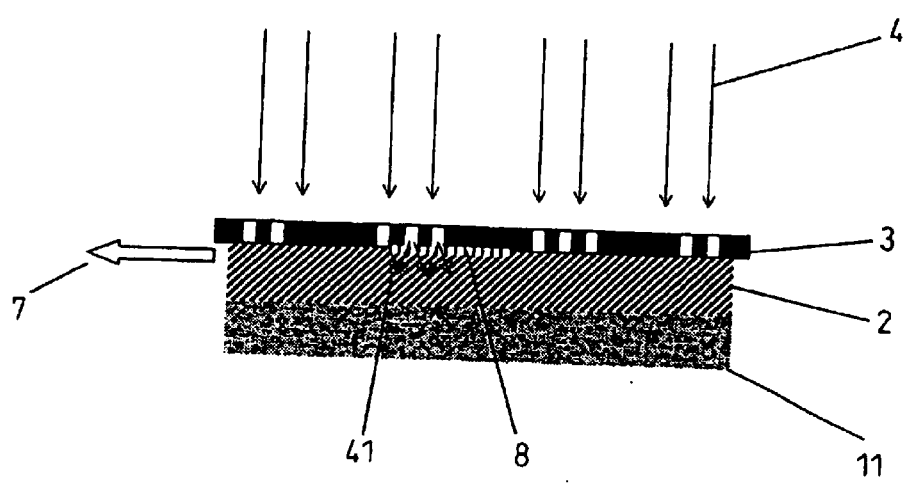
FIG. 17 is a process drawing of a conventional resist pattern generating method.
Figure 18A:
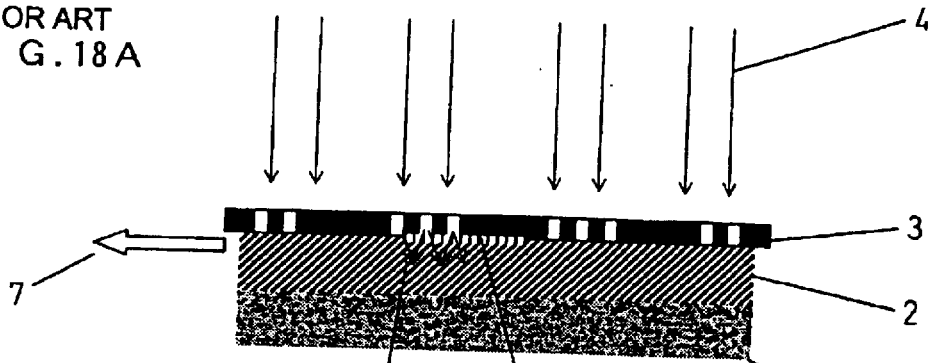
FIGS. 18A to 18D are process drawings of a conventional resist pattern generating method.
Figure 18B:
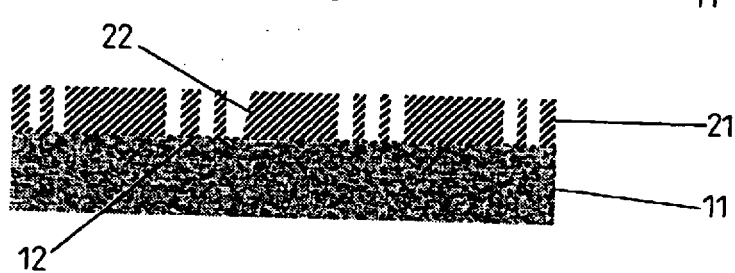
Figure 18C:
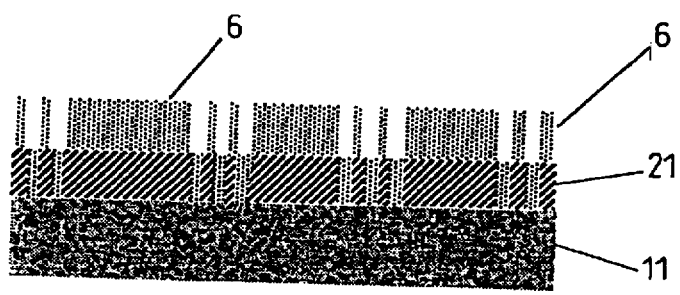
Figure 18D:
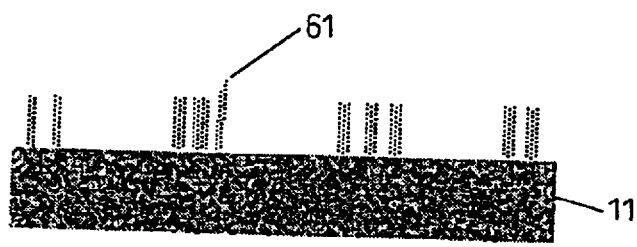
Figure 19:
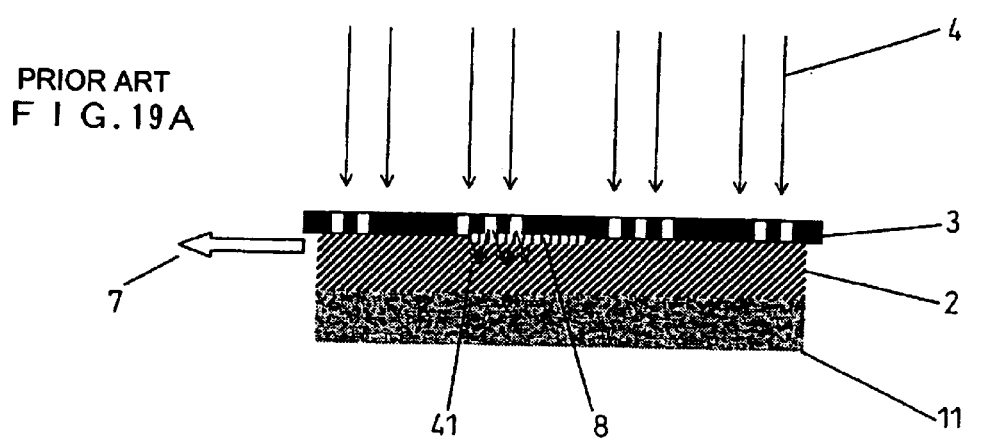
FIGS. 19A and 19B are process drawings of a conventional resist pattern generating method.
Figure 19:
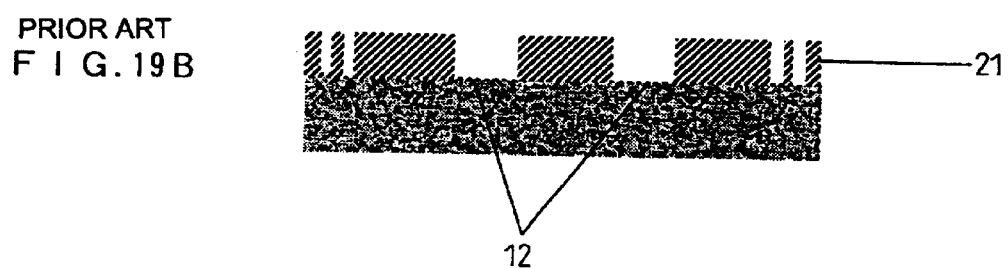

The photomask 101 in the foregoing embodiment may be used for fabrication of a semiconductor chip or a thin film magnetic head by providing the projections 102 for close contact and the recesses 103 for deaeration so as to be adjacent to each other both in the vertical and lateral directions as shown in FIG. 14A. As shown in FIG. 14B, by alternately providing the projections 102 for close contact and the recesses 103 for deaeration concentrically so as to extend from the center area toward the peripheral area, the photomask 101 may be used for fabrication of a spiral coil.

As described above, according to the foregoing embodiments, the air existing between the photomask 101 and the resist film 107 is easily deaerated via the recesses 103 for deaeration in the photomask 101 to improve the close contact between the photomask 101 and the resist film 107, thereby obtaining an excellent resist pattern shape as shown in FIG. 15. With respect to the above-described pattern exposure, as a preferred embodiment, the method of performing the exposure by using a photomask aligner, sealing a gap between a holder to which the substrate is attached and the photomask, and conducting deaeration by evacuation from the peripheral portion of the substrate can be mentioned but the invention is not always limited to the method.

While there has been described what is at present considered to be preferred embodiments of this invention, it will be understood that various modifications may be made therein, and it is intended to cover in the appended claims all such modifications as fall within the true spirit and scope of this invention.

What is claimed is:

1. A resist pattern generating method comprising:
   a first step of forming a resist film on a surface of a substrate;
   a second step of forming a recess for deaeration in an area where no pattern is generated and forming a projection for close contact in a pattern generating area in the surface of said resist film;
   a third step of making a photomask come into contact with the projection for close contact in said resist film and performing deaeration via said recess to thereby make said photomask and said projection come into close contact; and
   a fourth step of irradiating the photomask with exposure light in said close contact state to expose the surface of said projection formed on said resist film to light in correspondence with a pattern shape.

2. The resist pattern generating method according to claim 1, wherein in said second step, a plurality of said recesses are formed, and at least one of the recesses is formed so as to extend to a peripheral area of said resist film.

3. The resist pattern generating method according to claim 2, wherein an almost disc-shaped substrate is used as said substrate, and recesses for deaeration in said resist film are formed almost radially so as to extend from a center area of said resist film to said peripheral area.

4. The resist pattern generating method according to claim 1, wherein in said second step, a plurality of recesses for deaeration are formed so as to be connected to each other and at least one of said recesses is formed so as to extend to a peripheral area of said resist film.

5. A resist pattern generating method comprising:
   a first step of forming a resist film on a surface of a substrate;
   a second step of forming a recess for deaeration in an area where no pattern is generated and forming a projection for close contact in a pattern generating area in the surface of said resist film;
   a third step of making a photomask come into contact with the projection for close contact in said resist film and performing deaeration via said recess to make said photomask and said projection in said resist film come into close contact; and
   a fourth step of irradiating the photomask with exposure light in said close contact state to expose the surface of said projection formed on said resist film in correspondence with a pattern shape;
   wherein in said second step, a plurality of said recesses and a plurality of said projections are formed so as to be adjacent to each other, and at least one of said recesses is formed so as to extend to a peripheral area of said resist film.

6. A resist pattern generating method comprising:
   a first step of preparing a photomask having, on its rear face side, a projection for close contact and a recess for deaeration, said projection having a light transmitting portion in a predetermined shape,
   a second step of forming a resist film on a surface of a substrate;
   a third step of placing the rear face side of the photomask on the surface of said resist film formed on the surface of said substrate;
   a fourth step of deaerating air existing between the rear face side of said photomask and the surface of said resist film to the outside via said recess in said photomask in a state where said photomask is placed on the surface of said resist film to thereby make said rear face side of said photomask and the surface of said resist film come into close contact;

a fifth step of irradiating the photomask with exposure light from the surface side of said photomask in said close contact state to expose the surface of said resist film to light in correspondence with the pattern shape formed in said projection of said photomask; and a sixth step of developing said resist film.

* * * * *